United States Patent
Interrante et al.

(10) Patent No.: US 10,541,156 B1
(45) Date of Patent: Jan. 21, 2020

(54) MULTI INTEGRATED CIRCUIT CHIP CARRIER PACKAGE

(71) Applicant: International Business Machines Corporation, Armonk, NY (US)

(72) Inventors: Marcus E. Interrante, Ulster, NY (US); Kathryn R. Lange, Marlboro, NY (US); Kamal K. Sikka, Poughkeepsie, NY (US); Tuhin Sinha, Oradell, NJ (US); Hilton T. Toy, Hopewell Junction, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/176,167

(22) Filed: Oct. 31, 2018

(51) Int. Cl.
  *H01L 21/52* (2006.01)
  *H01L 23/32* (2006.01)
  *H01L 23/36* (2006.01)

(52) U.S. Cl.
  CPC .............. *H01L 21/52* (2013.01); *H01L 23/32* (2013.01); *H01L 23/36* (2013.01)

(58) Field of Classification Search
  None
  See application file for complete search history.

(56) References Cited

U.S. PATENT DOCUMENTS

| | | | |
|---|---|---|---|
| 7,030,487 B1 | 4/2006 | Keng | |
| 7,733,655 B2 | 6/2010 | Beaumier et al. | |
| 7,944,046 B2 | 5/2011 | Chao | |
| 8,421,217 B2 | 4/2013 | Casey et al. | |
| 9,496,194 B2 | 11/2016 | Arvelo et al. | |
| 9,743,558 B2 | 8/2017 | Bosak et al. | |
| 9,937,662 B2 | 4/2018 | Kuczynski et al. | |
| 9,941,184 B2 | 4/2018 | De Sousa et al. | |
| 2005/0127500 A1 | 6/2005 | Colgan et al. | |
| 2013/0016477 A1* | 1/2013 | Yokoya | H01L 23/36 361/719 |
| 2013/0147028 A1 | 6/2013 | Su et al. | |

(Continued)

FOREIGN PATENT DOCUMENTS

CN 105764298 A 7/2016

OTHER PUBLICATIONS

"A Method of reducing the TIM BLT using a Jig," Disclosed Anonymously, IPCOM000247995D, Oct. 14, 2016.

*Primary Examiner* — Asok K Sarker
(74) *Attorney, Agent, or Firm* — ZIP Group PLLC

(57) ABSTRACT

A multi integrated circuit (IC) chip package includes multiple IC chips, a carrier, and a lid. The IC chips may be connected to the carrier. Alternatively, each IC chip may be connected to an interposer and multiple interposers may be connected to the carrier. The carrier may be positioned within a carrier deck. The lid may be positioned relative to carrier by aligning one or more alignment receptacles within the lid with one or more respective alignment protrusions of the carrier deck. A compression fixture cover may contact the lid and exert a force toward the carrier deck, respective lid pedestals may be loaded toward respective IC chips, and an integral lid foot may be loaded toward the carrier. While under compression, thermal interface material between respective lid pedestals and respective IC chips and seal band material between the integral foot and the carrier may be cured.

20 Claims, 8 Drawing Sheets

(56) References Cited

U.S. PATENT DOCUMENTS

| | | | |
|---|---|---|---|
| 2015/0077944 A1* | 3/2015 | Li | H01L 23/02 |
| | | | 361/719 |
| 2015/0130045 A1* | 5/2015 | Tseng | H01L 23/36 |
| | | | 257/712 |
| 2015/0235936 A1* | 8/2015 | Yu | H01L 23/49816 |
| | | | 257/738 |
| 2016/0240511 A1* | 8/2016 | Dry | H01L 23/13 |
| 2019/0067214 A1* | 2/2019 | Sato | H01L 23/3735 |
| 2019/0088577 A1* | 3/2019 | Shimoyama | H01L 23/36 |

* cited by examiner

MULTI INTEGRATED CIRCUIT CHIP CARRIER PACKAGE

FIELD OF THE EMBODIMENTS

Embodiments of the present invention generally relate to electronic components, such as an electronic package, that includes a multi integrated circuit (IC) chip carrier.

DESCRIPTION OF THE RELATED ART

Electronic system performance improvement requires higher levels of integration. This can be accomplished by utilizing a multi IC chip carrier that includes multiple IC chips on a single carrier.

SUMMARY

In an embodiment, an electronic device fabrication method is presented. The method includes positioning a multiple IC chip carrier against a carrier deck that comprises a plurality of alignment protrusions. The method further includes aligning a lid, that includes a plurality of alignment receptacles, with the multiple IC chip carrier by receiving the plurality of alignment protrusions within the plurality of alignment receptacles. The method further includes connecting the lid to the multiple IC chip carrier and connecting the lid to each IC chip of the multiple IC chip carrier. The method further includes removing the multiple IC chip carrier from the carrier deck.

In another embodiment of the present invention, a multiple integrated circuit (IC) chip carrier package fabrication system is presented. The system includes a carrier deck that includes a carrier recess and a plurality of alignment protrusions. The system further includes a multiple IC chip carrier that includes multiple IC chips. The multiple IC chip carrier is positioned within the carrier recess. The system further includes a lid that includes multiple IC chip pockets that each have an IC chip pedestal, an underside integral lid foot, and a lid brim that includes a plurality of alignment receptacles. The plurality of alignment protrusions are positioned within the plurality of alignment receptacles and wherein the underside integral lid foot is connected to the multiple IC chip carrier. Each of the IC chip pedestals is connected to an IC chip of the multiple IC chip carrier.

In another embodiment, a multiple IC chip carrier package fabrication method is presented. The method includes positioning a multiple IC chip carrier against a carrier deck that includes a plurality of alignment protrusions. The method includes aligning a lid, that includes a plurality of alignment receptacles, with the multiple IC chip carrier by receiving the plurality of alignment protrusions within the plurality of alignment receptacles. The method further includes connecting the lid to the multiple IC chip carrier and connecting the lid to each IC chip of the multiple IC chip carrier. The method further includes removing the multiple IC chip carrier from the carrier deck.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

A multi integrated circuit (IC) chip package includes multiple IC chips, a carrier, and a lid. The IC chips may be connected to the carrier. Alternatively, each IC chip may be connected to an interposer and multiple interposers may be connected to the carrier. The carrier may be positioned within a carrier deck. The lid may be positioned relative to carrier by aligning one or more alignment receptacles within the lid with one or more respective alignment protrusions of the carrier deck. A compression fixture cover may contact the lid and exert a force toward the carrier deck, respective lid pedestals may be loaded toward respective IC chips, and an integral lid foot may be loaded toward the carrier. While under compression, thermal interface material between respective lid pedestals and respective IC chips and seal band material between the integral foot and the carrier may be cured.

Figure 1:
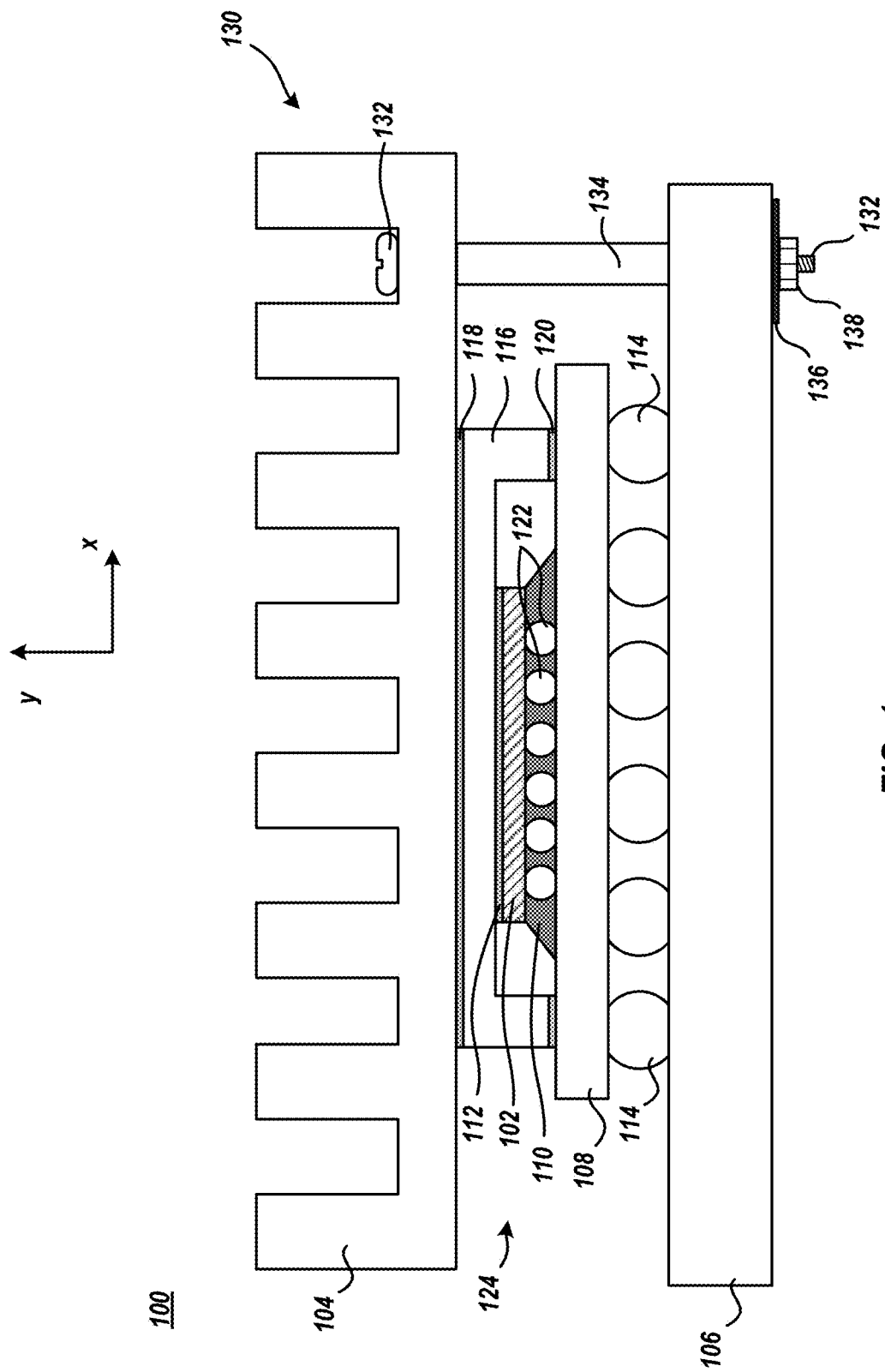
FIG. 1 depicts a cross section of a prior art electronic system.

FIG. 1 depicts a prior art electronic system 100 that includes an IC carrier package 124. Electronic system 100 may be for example a computer, server, mobile device, tablet, kiosk, or the like. Package 124 includes chip 102, carrier 108, interconnects 122, underfill 110, thermal interface material 112, lid 116, and adhesive 120. Chip 102 may be an IC chip, semiconductor die, processor, microchip, field programmable gate array, or the like. Carrier 108 may be an organic carrier or a ceramic carrier and provides mechanical support for chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, and the like. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108, a lid 116 is attached to carrier 108 with adhesive 120 to cover chip 102. Generally, during operation of electronic system 100, heat is removed from chip 102. In this situation, lid 116 is both a cover and a conduit for heat transfer. As such, a thermal interface material 112 may thermally join lid 116 and chip 102.

Package 124 may be connected to a motherboard 106 via interconnects 114. Motherboard 106 may be the main printed circuit board of electronic system 100 and includes electronic components, such as a graphics processing unit, memory, and the like, and provides connectors for other peripherals. Interconnects 114 electrically connect the lower side of carrier 108 to motherboard 106 and may be a wire bond, solder bond, stud, conductive ball, conductive button, and the like. Interconnects 114 may be larger and thus more robust than interconnects 122. When package 124 is seated upon motherboard 106 a second reflow process may be performed to join interconnects 114 to electrical contacts of both carrier 108 and motherboard 106. Alternately, a mechanical pressurized interconnect via an intervening socket may be established.

To assist in the removal of heat from chip 102, a heatsink 104 may be thermally joined to package 124 via thermal interface material 118. Heatsink 104 cools chip 102 by dissipating heat into the surrounding air. As such, during operation of electronic system 100, heat transfer exists through chip 102 to heatsink 104 through thermal interface material 112, lid 116, and thermal interface material 118, and the like. Heatsink 104 may be connected to motherboard 106 via one or more connection device 130. Connection device 130 may include a threaded fastener 132, standoff 134, backside stiffener 136, and fastener 138. Threaded fastener 132 may extend through heatsink 104, standoff 134, and backside stiffener 136 and provides compressive force between heatsink 104 and backside stiffener 136. The length of standoff 134 may be selected to limit the pressure exerted upon package 124 by heatsink 104 created by the compressive forces. Backside stiffener 136 may mechanically support the compressive forces by distributing the forces across a larger area of motherboard 104. In other applications, connection device 130 may be a clamp, non-influencing fastener, cam, and the like, system that adequately forces heatsink 104 upon package 124.

Figure 2:
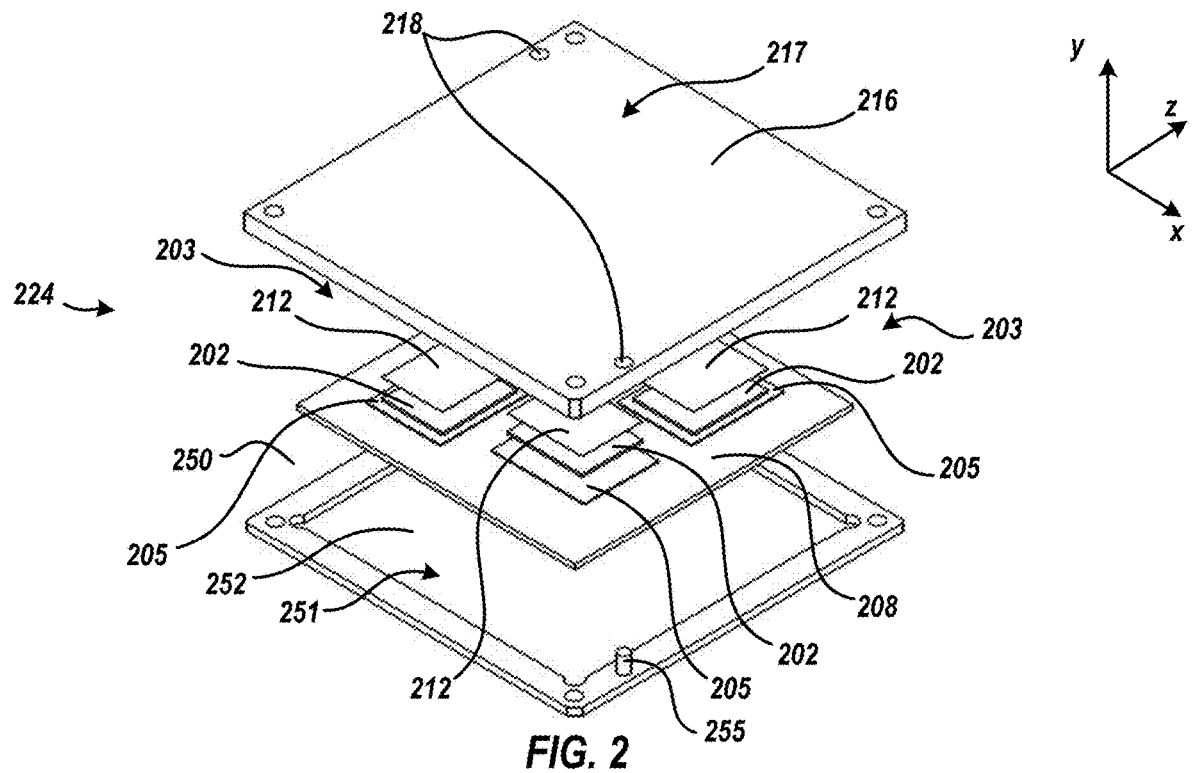
FIG. 2 depicts an isometric view of components utilized in fabricating a multi IC chip carrier package, according to one or more embodiments of the present invention.

FIG. 2 depicts an isometric view of components utilized in fabricating a multi IC chip carrier package 224, according to one or more embodiments of the present invention. Package 224 includes multiple IC chips 202, carrier 208, and lid 216. IC chips 202 may be IC chips, semiconductor dies, processors, microchips, field programmable gate arrays, or the like. Each IC chip 202 may be the same type of IC chip or may be different types of IC chips. Carrier 208 may be an organic carrier and provides mechanical support for chips 202. Carrier 208 includes sites 203 that include an array of conductive contacts 209, shown for example in FIG. 3, that are on or within the upper surface and an array of conductive contacts 211, shown for example in FIG. 9, that are on or within the lower surface of carrier 208. Contacts 209, 211 are electrically conductive and may be a pad, post, stud, or the like. Carrier 208 also includes internal electrical pathways and/or devices that electrically the different contacts 209, 211. For example, numerous different electrically pathways may electrically connect a contact 209 on the upper surface of carrier 208 with a contact 211 on the lower surface of carrier 208.

Figure 4A:
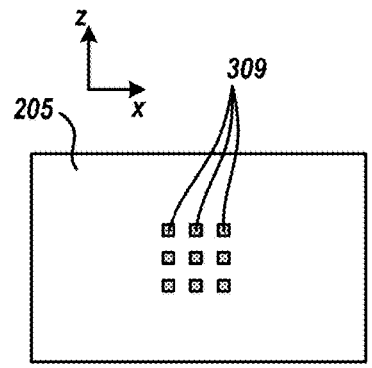
FIG. 4A depicts a normal view of a IC chip interposer at a particular fabrication stage, according to one or more embodiments of the present invention.
Figure 4B:
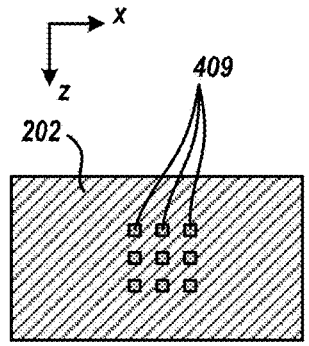
FIG. 4B depicts a normal view of a IC chip at a particular fabrication stage, according to one or more embodiments of the present invention.

The IC chips 202 may be directly connected to the carrier 208 by interconnects 222, shown for example, in FIG. 4B. Interconnects 222 may electrically connect a respective chip 202 and with contacts 209 that are within or upon the upper surface of carrier 208. Interconnects 222 may be a wire, solder, stud, conductive ball, conductive button, or the like. In some embodiments, subsequent to chips 202 being seated (e.g., electrically connected to, etc.) carrier 208, a reflow process may be performed to join and electrically connect interconnects 222 to the contacts of respective chips 202 and respective contacts 209 of carrier 208.

Underfill may be electrically-insulating, may substantially surround interconnects 222, may isolate individual interconnects 222, and may provide mechanical support between the respective chip 202 and carrier 208. The underfill may also prevent damage to individual interconnects 222 due to thermal expansion mismatches between the respective chip 202 and carrier 208.

Alternatively, the IC chips 202 may be indirectly connected to the carrier 208 via an interposer 205. The interconnects 222, shown for example, in FIG. 4C may electrically connect a respective chip 202 and with contacts 409 that are within or upon the upper surface of interposer 205. In some embodiments, subsequent to chips 202 being seated (e.g., electrically connected to, etc.) interposer 205, a reflow process may be performed to join and electrically connect interconnects 222 to the contacts of respective chips 202 and respective contacts 409 of interposer 205. Underfill 411, shown for example in FIG. 4C, may be electrically-insulating, may substantially surround interconnects 222, may isolate individual interconnects 222, and may provide mechanical support between the respective chip 202 and interposer 205. Underfill 411 may also prevent damage to individual interconnects 222 due to thermal expansion mismatches between the respective chip 202 and interposer 205.

Figure 7:
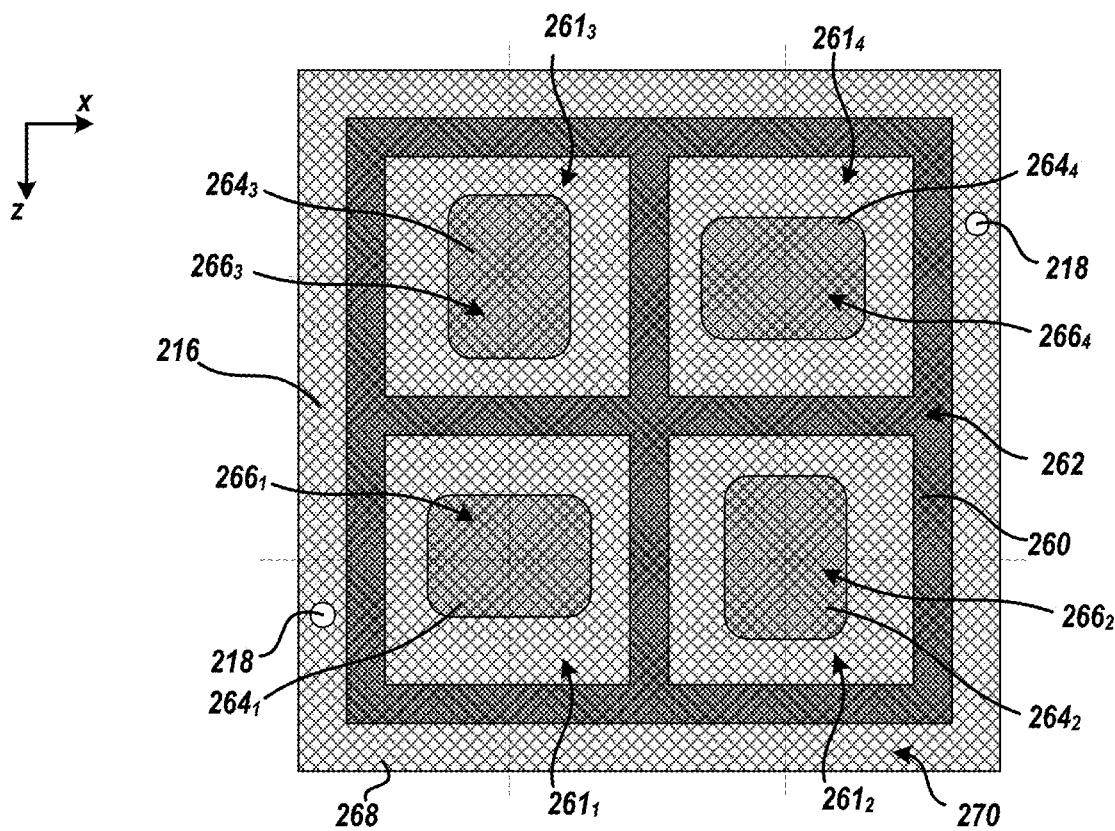
FIG. 7 depicts a normal view of an underside of a lid, according to one or more embodiments of the present invention.

Thermal interface material 212 may be applied to an upper surface of each of the chips 202 or may be applied to a pedestal surface 266, shown for example in FIG. 7, of lid 216. Thermal interface material 212 is a material that is inserted between a respective chip 202 and lid 216, in order to enhance the thermal coupling there between. Thermal interface material 212 may be thermal grease, thermal adhesive, thermal gap filler, thermally conductive pad, thermal tape, or the like. In some implementations, thermal interface material 212 may be cured (i.e. the process of toughing or hardening of a polymer material by cross-linking of polymer chains).

To align the lid 216 and the carrier 208, the carrier 208 may be positioned within a carrier deck 250. Carrier deck 250 may include a recess 252 having a recess surface 251. Recess 252 may have a substantially similar x-axis dimension and z-axis dimension relative such dimensions of the carrier 208 such that carrier 208 may lay within the recess 252 against recess surface 251 with little to no relative movement therebetween. In other words, when carrier 208 is positioned within recess 251, carrier 208 movement in the x-axis and z-axis direction relative to carrier deck 252 is generally fixed. Generally, carrier deck 250 includes one or more features to prevent carrier 208 movement in the x-axis and z-axis direction relative to carrier deck 252.

The lid 216 may be positioned relative to carrier 208 by aligning one or more alignment receptacles 218 within lid 216 with one or more respective alignment protrusions 255 of the carrier deck 250. Generally, an x-axis and z-axis diameter of alignment protrusions 255 is less than the similar x-axis and z-axis diameter of alignment receptacles 218 such that such that alignment protrusions 255 may be received within alignment receptacles 218 with little to no relative movement in the x-axis or z-axis therebetween. In other words, when alignment protrusions 255 is positioned within alignment receptacles 218, lid 216 movement in the x-axis and z-axis direction relative to carrier deck 252 and carrier 208 is generally fixed while lid 216 is free to move relative to carrier deck 252 and carrier 208 in the y-axis direction.

The carrier deck 250 may further include one or more fastener receptacles 257. Each fastener receptacle 257 may engage with a fastener 700, show for example in FIG. 9. For example, an external thread of fastener 700 may engage with an internal thread of fastener receptacle 257. The fastener 700 may exert a compressive force between compression fixture cover 280, shown for example in FIG. 8, and the carrier deck 250

Figure 3:
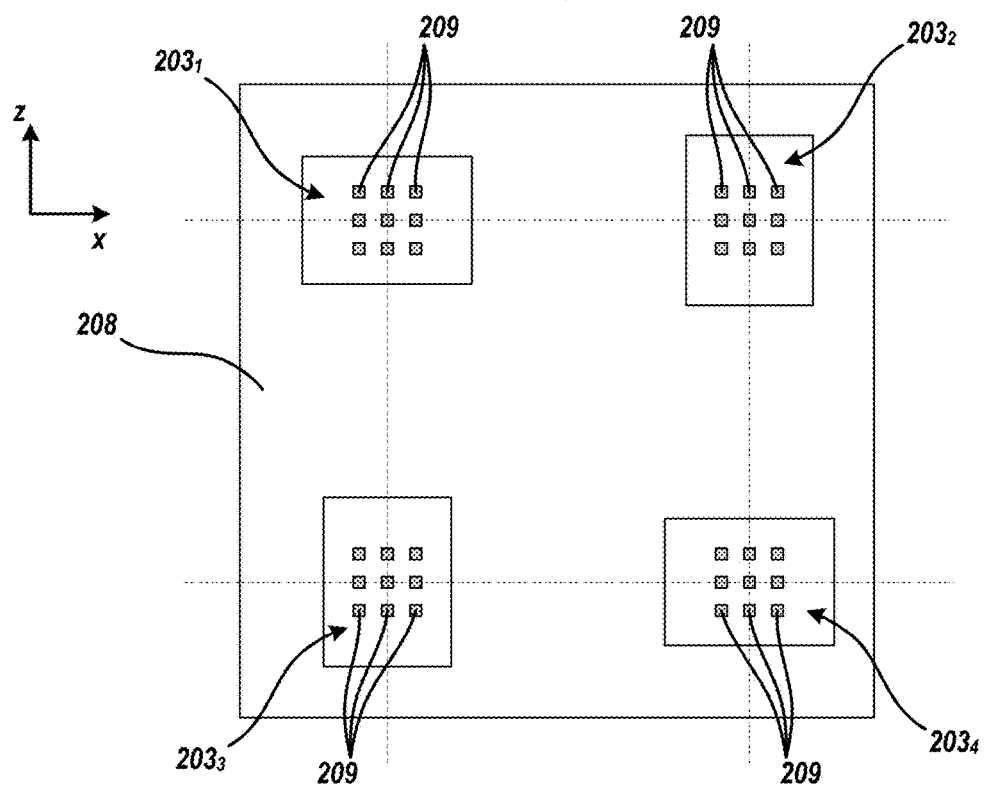
FIG. 3 depicts a normal view of a multi IC chip carrier at a particular fabrication stage, according to one or more embodiments of the present invention.

FIG. 3 depicts a normal view of a multi IC chip carrier 208 at a particular fabrication stage prior to electrically attaching chips 202 to the carrier 208, according to one or more embodiments of the present invention. Carrier 208 upper surface, as shown, and opposing lower surface include multiple sites 203 that include contacts 209 with each site 203 generally associated with one chip 202. For example, carrier 208 upper surface may include site $203_1$, $203_2$, $203_2$, and $203_4$. The center of each site 203 may be aligned with a neighbor site 203. For example, the center of site $203_1$ may be aligned with the center of site $203_2$ (i.e. the respective centers lay on the same x-axis) and may be aligned with the center of site $203_3$ (i.e. the respective centers lay on the same z-axis). Similarly, the center of site $203_4$ may be aligned with the center of site $203_3$ (i.e. the respective centers lay on the same x-axis) and may be aligned with the center of site $203_2$ (i.e. the respective centers lay on the same z-axis).

In some embodiments, the IC chip carrier 208 is configured to be symmetrically balanced such that the sites 203 are radially symmetrical with respect to the center of carrier 208. In other words, for any radius that intersects opposite sites (i.e. $203_1$ and $203_4$ or $203_2$ and $203_3$) the same dimension "n" of the intersection of the radius and the respective site perimeter exists relative to the opposite sites. For example, radius "a" of carrier 208 intersects the center of carrier 208 and opposite sites $203_2$ and $203_3$. The intersection of radius "a" with the perimeter of each site $203_2$ and $203_3$ has the same dimension "m" when sites $203_2$ and $203_3$ are radially symmetrical. Likewise, radius "b" of carrier 208 intersects the center of carrier 208 and opposite sites $203_1$ and $203_4$. The intersection of radius "b" with the perimeter of each site $203_1$ and $203_4$ has the same dimension "n" when sites $203_1$ and $203_4$ are radially symmetrical.

In some embodiments, the circumferential shape of sites 203 may be relatively different. For example, the shape of site $203_1$ and the shape of site $203_4$ may be rectangular and the shape of site $203_2$ and $203_3$ may be square, circular, hexagonal, or the like. Alternatively, as depicted, the circumferential shape of sites 203 may be the same. For example, the shape of site $203_1$, site $203_2$, $203_3$, and $203_4$ may be may be rectangular. In some implementations, the orientation of circumferential shapes of sites 203 may be the same. However, in other implementations, the orientation of the shape of sites 203 may be different. For example, as depicted, the orientation of site $203_1$ and the orientation of site $203_4$ may be a landscape orientation and the orientation of site $203_2$ and the orientation of site $203_3$ may be a portrait orientation.

The contacts 209 within each site 203 may be arranged in a matrix of rows and columns. The circumferential shape of the matrix of contacts 209 may be the same as or different from the perimeter shape of the associated site 203.

The circumferential shape and/or orientation of the IC chip 202 may be the same as the circumferential shape of the associated site 203. For example, the circumferential shape and orientation of the IC chip $202_1$ is the same as the circumferential shape of site $203_1$, the circumferential shape and orientation of the IC chip $202_2$ is the same as the circumferential shape of site $203_2$, the circumferential shape and orientation of the IC chip $202_3$ is the same as the circumferential shape of site $203_3$, and the circumferential shape and orientation of the IC chip $202_4$ is the same as the circumferential shape of site $203_4$. Likewise, the center of each IC chip 202 may be coincident with the center y-axis of the associated site 203.

Figure 4C:
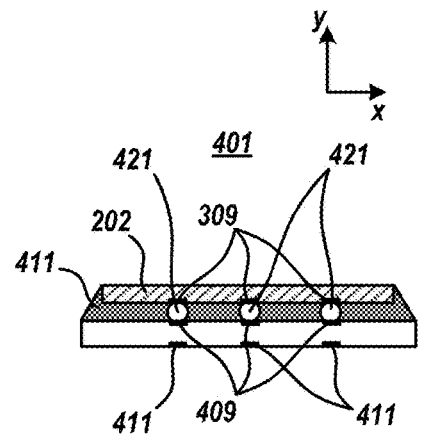
FIG. 4C depicts a cross section view of a IC chip and interposer package at a particular fabrication stage, according to one or more embodiments of the present invention.

FIG. 4A depicts a normal view of IC chip interposer 205 and FIG. 4B depicts a normal view of IC chip 202. FIG. 4C depicts a cross section view of IC chip and interposer package 401.

Interposer 205 includes contacts 409 upon or within its upper surface and contacts 509 upon or within its lower surface. Contacts 409, 509 are electrically conductive and may be a pad, post, stud, or the like. Interposer 205 also includes internal electrical pathways and/or devices that electrically the different contacts 409 and 509. For example, numerous different electrically pathways may electrically connect a contact 409 on the upper surface of interposer 205 with a contact 509 on the lower surface of interposer 205. The contacts 409, 509 may be arranged in an array or matrix of rows and columns and may be respectively the same or different shape.

IC chip 202 includes contacts 309 upon or within its lower surface. Contacts 309 are electrically conductive and may be a pad, post, stud, or the like. IC chip 202 also includes internal electrical pathways and/or devices that transfer electrical signals, ground, power, or the like to contacts 309. For example, numerous different electrically pathways may electrically connect to a contact 309. The contacts 309 may be arranged in an array or matrix of rows and columns and may be respectively the same or different shape.

Each IC chip 202 may be connected interposer 205 by interconnects 222. Each interconnect 222 may electrically connect a contact 309 of IC chip 202 with a contact 409 that are within or upon the upper surface of interposer 205. In some embodiments, subsequent to chips 202 being seated (e.g., electrically connected to, etc.) with interposer 205, a reflow process may be performed to join and electrically connect interconnects 222 to the contacts 309, 409. Underfill 411 may be applied between the IC chip 202 and interposer 205 and may be electrically-insulating, may substantially surround interconnects 222, may isolate individual interconnects 222, and may provide mechanical support between the respective chip 202 and interposer 205. Underfill 411 may also prevent damage to individual interconnects 222 due to thermal expansion mismatches between the respective chip 202 and interposer 205. Underfill 411 may be applied upon the interposer 205 around each IC chip 202 and capillary action may draw the underfill 411 underneath each IC chip 202 to surround each interconnect 222.

In embodiments, interposer 205 may be a chip scale package (CSP) interposer and IC chip and interposer package 401 may be a CSP 401. As such, the IC chip 202 may be connected to interposer 205 via interconnects 222 or interposer 205 may be formed directly chip 202 (i.e. a wafer level package, or the like), as is known in the art.

Figure 5:
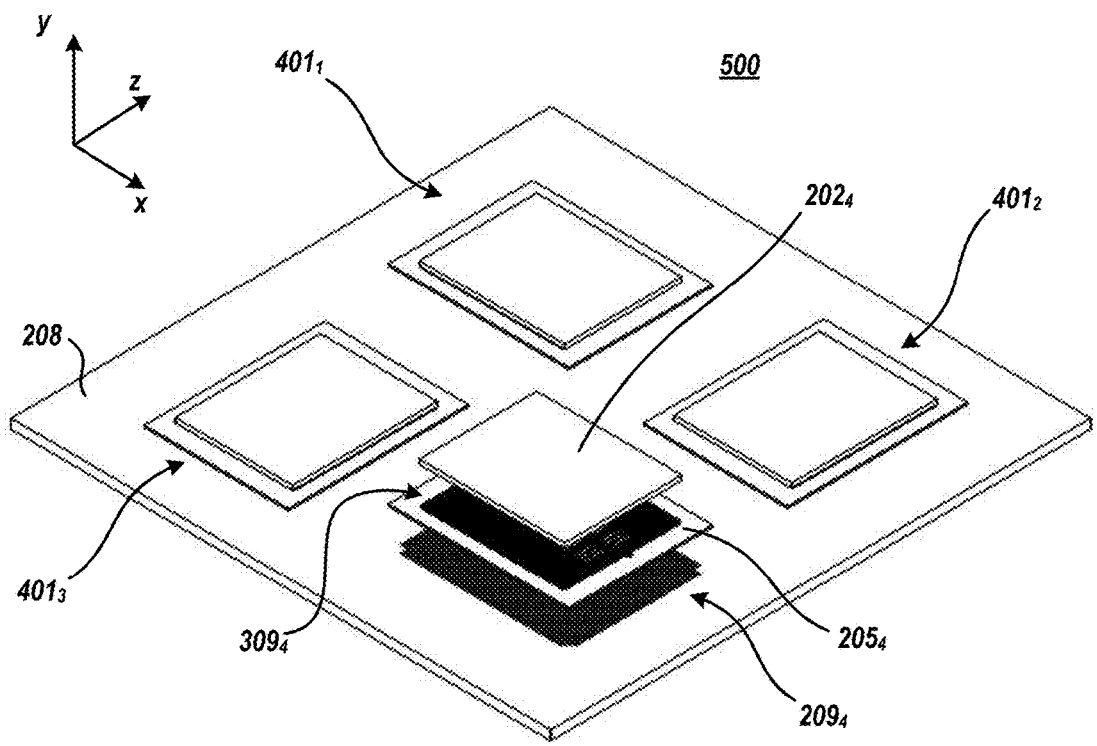
FIG. 5 depicts an isometric view of a multi IC chip module at a particular fabrication stage, according to one or more embodiments of the present invention.

FIG. 5 depicts an isometric view of a multi IC chip module 500 at a particular fabrication stage, according to one or more embodiments of the present invention. IC chip module 500 includes multiple IC chips 202 seated upon carrier 208. In some embodiments, IC chip module 500 includes IC chips 202 seated directly upon carrier 208 via interconnects 222 (i.e. interconnects connect contacts 309 of each IC chip 202 with contacts 209 of carrier 208). In other embodiments, as shown, IC chip module 500 includes multiple chip and interposer packages 401 connected to carrier 208.

Each chip and interposer package 401 may be connected to carrier 208 by interconnects 222. Each interconnect 222 may electrically connect a contact 509 of interposer 205 with a contact 209 that are within or upon the upper surface of carrier 208. In some embodiments, subsequent to chip and interposer package 401 being seated (e.g., electrically connected to, etc.) with carrier 208, a reflow process may be performed to join and electrically connect interconnects 222 to the contacts 509,209. Underfill 511, shown for example FIG. 9, may be applied between chip and interposer package 401 and carrier 208 and may be electrically-insulating, may substantially surround interconnects 222, may isolate individual interconnects 222, and may provide mechanical support between the respective interposer 205 and carrier 208. Underfill 511 may also prevent damage to individual interconnects 222 due to thermal expansion mismatches between the respective chip and interposer package 401 and carrier 208. Underfill 511 may be applied upon the carrier 208 around each chip and interposer package 401 and capillary action may draw the underfill 511 underneath each chip and interposer package 401 to surround each interconnect 222.

Figure 6A:
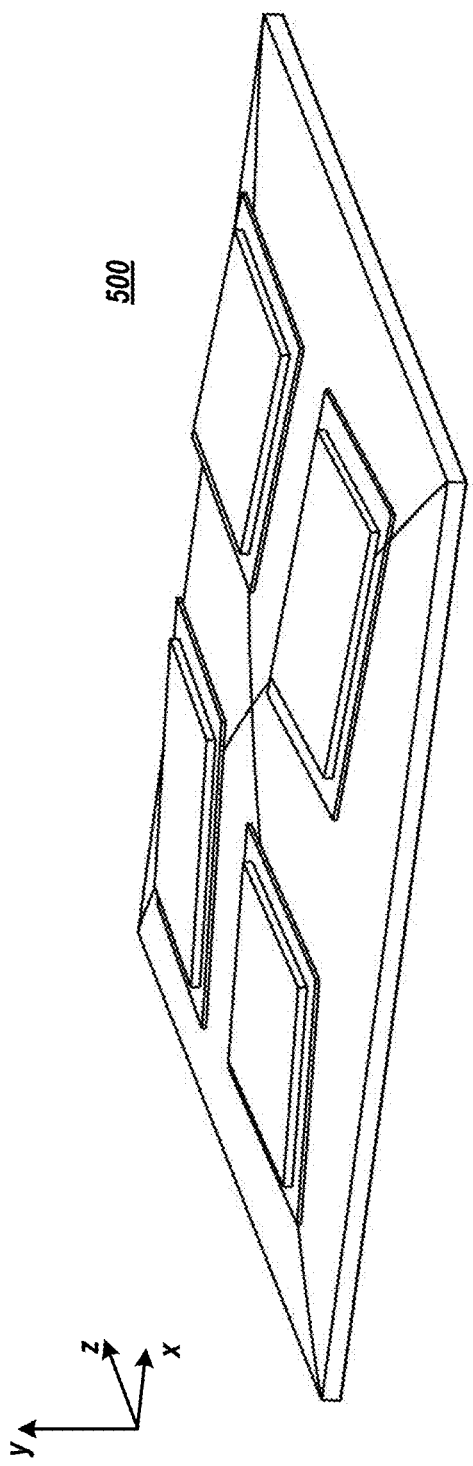
FIG. 6A depicts an isometric view of a multi IC chip module at a particular fabrication stage, according to one or more embodiments of the present invention.
Figure 6B:
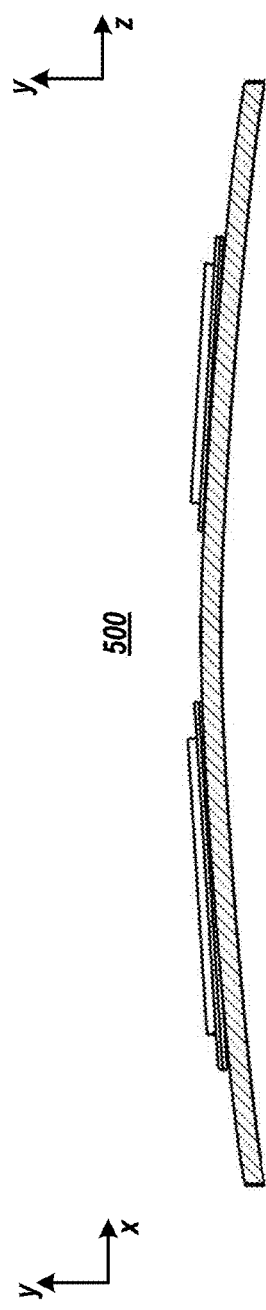
FIG. 6B depicts a cross section view of a multi IC chip carrier package at a particular fabrication stage, according to one or more embodiments of the present invention.

FIG. 6A and FIG. 6B depicts an isometric view of a multi IC chip module 500. Prior to the lid 208 being attached to the carrier 208, the carrier 208 may be convex (i.e. the center of the carrier 208 top surface is higher relative to the perimeter edges of the top surface of carrier 208 and the center of the carrier 208 bottom surface is higher relative to the perimeter edges of the bottom surface of carrier 208). In some implementations, subsequent to each IC chip 202 being electrically connected to carrier 208, the upper surface of each IC chip 202 may be substantially coplanar (i.e. coplanar plus or minus an appropriate manufacturing tolerance).

FIG. 5 depicts a normal view of an underside of lid 216 of multi IC chip carrier package 224, according to one or more embodiments of the present invention. The underside of lid 216 may include surface 262 of integral lid foot 260, a surface 266 of each pedestal 264, and surface 270 of lid brim 268.

The surface 262 is configured to attach to the upper surface of carrier 208 (e.g., via seal band 220 as shown for example in FIG. 9, or the like) and may be a planar surface. Portions of surface 262 may be configured to attach to carrier 208 around the perimeter of all of the sites 203 and other portions of surface 262 may be configured to attach to carrier 208 between sites 203.

Surface 266 of each pedestal 264 is configured to attach (e.g., via thermal interface material 212, or the like) to the top surface of the respective IC chip 202. For example, surface $266_1$ is configured to thermally connect with the tope surface of IC chip $202_1$, surface $266_2$ is configured to thermally connect with the tope surface of IC chip $202_2$, surface $266_3$ is configured to thermally connect with the tope surface of IC chip $202_3$, and surface $266_4$ is configured to thermally connect with the tope surface of IC chip $202_4$. Each surface 266 of each pedestal 264 may be generally coplanar of flat.

Surface 270 of lid brim 268 extends radially outward from the sidewalls of integral lid foot 260 with respect to the center of lid 216. In some implementations, the one or more alignment receptacles 218 may extend though lid brim 268 from surface 270 to the upper surface of lid 216.

Surface 270 is recessed relative to surface 262 and allow for portions of integral lid foot 260 to surround each site 203 and/or chip 202 to form a site pocket 261 around the circumference of each site 203 and/or chip 202. For example, a site pocket $261_1$ is formed around site $203_1$ and/or chip $202_1$, a site pocket $261_2$ is formed around site $203_2$ and/or chip $202_2$, a site pocket $261_3$ is formed around site $203_3$ and/or chip $202_3$, and a site pocket $261_4$ is formed around site $203_4$ and/or chip $202_4$. A bisector axis through the center of each spring 630 may be coincident with the center of the associated chip 202.

Figure 8:
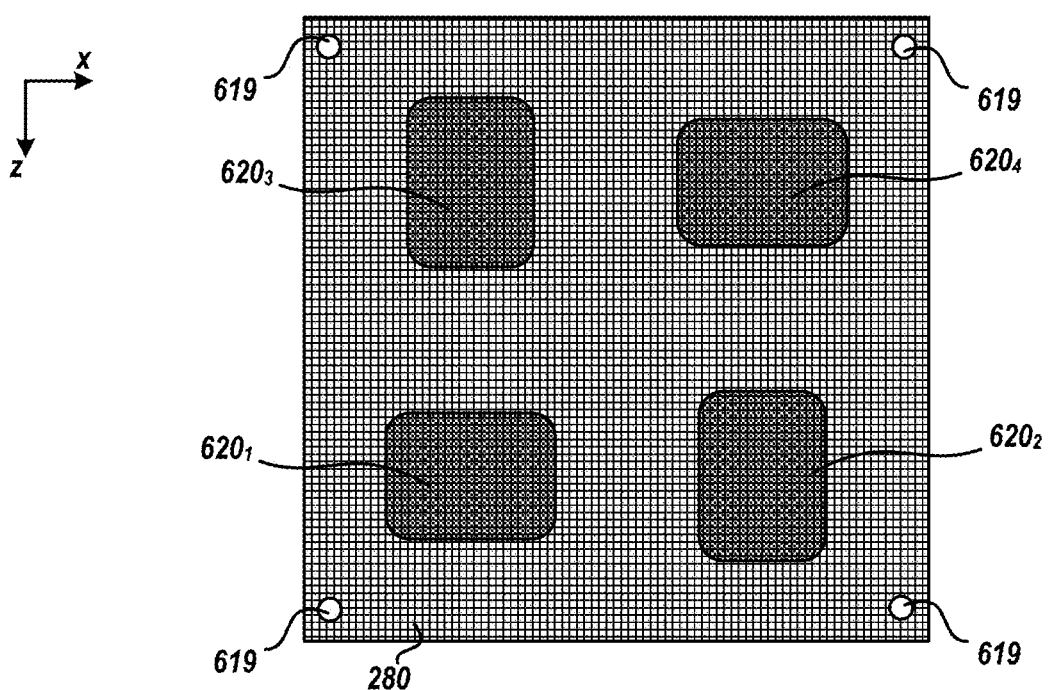
FIG. 8 depicts a normal view of an underside of a compression fixture cover, according to one or more embodiments of the present invention.

FIG. 8 depicts a normal view of an underside of a compression fixture cover 280, according to one or more embodiments of the present invention. Fixture cover 280 may include fixture pedestals 620 and clearances 619. Fixture pedestals are connected to cover 280 by a spring 630, as is exemplarily shown in FIG. 9. Clearances 619 are holes or voids that extend through the cover 280 and are configured to allow fastener 700 to extend therethrough. In embodiments, a bottom surface of each fixture pedestal 620 (i.e. the surfaces that contact the upper surface of lid 216) are coplanar or are generally flat.

Figure 9:
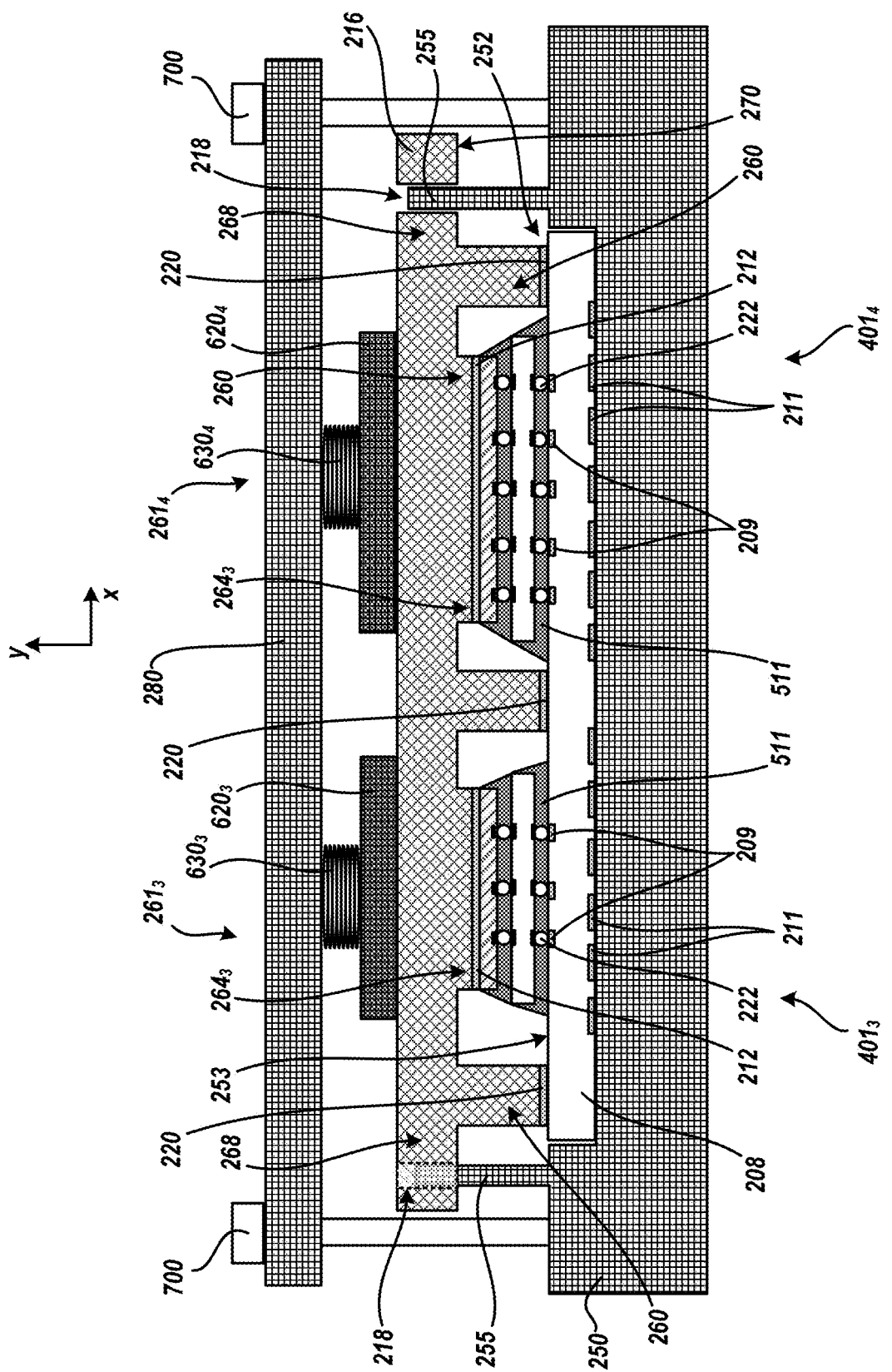
FIG. 9 depicts a cross-section view of a multi IC chip carrier package at a particular fabrication stage, according to one or more embodiments of the present invention.

FIG. 9 depicts a cross-section view of multi IC chip carrier package 224 at a particular fabrication stage, according to one or more embodiments of the present invention. At the present fabrication stage, lid 216 is attached to carrier 208.

Seal band material 220 is a thermally conductive epoxy, adhesive, or the like, that adheres lid 220 to carrier 208. Seal band material 220 is generally a material that enhances the coupling between lid 216 and carrier 208. Seal band material 220 may be applied to surface 262 of lid 216 and/or applied around the perimeter of each site 203 in the locations of carrier 208 in which surface 262 of lid 216 is configured to join therewith. In some embodiments, seal band material 220 may be cured.

Thermal interface material 212 may be applied to the upper surface of each of the IC chips 202 and/or may be applied to a pedestal surface 266 of each lid pedestal 264 of the lid 216.

To align the lid 216 and the carrier 208, the carrier 208 may be positioned within recess 252 of carrier deck 250 so that carrier 208 movement in the x-axis and z-axis direction relative to carrier deck 252 is generally fixed.

The lid 216 may be positioned relative to carrier 208 by aligning one or more alignment receptacles 218 within the lid brim 268 of lid 216 with one or more respective alignment protrusions 255 of the carrier deck 250. The one or more alignment protrusions 255 may extend upward from surface 253 of carrier deck 250. Generally, an x-axis and z-axis diameter of alignment protrusions 255 is less than the similar x-axis and z-axis diameter of alignment receptacles 218 such that such that alignment protrusions 255 may be received within alignment receptacles 218 with little to no relative movement in the x-axis or z-axis therebetween. In other words, when alignment protrusions 255 is positioned within alignment receptacles 218, lid 216 movement in the x-axis and z-axis direction relative to carrier deck 252 and carrier 208 is generally fixed while lid 216 is free to move relative to carrier deck 252 and carrier 208 in the y-axis direction. In some embodiments, the upper surface of each one or more alignment protrusions 255 may be between surface 270 of lid brim 268 and the upper surface of lid 216.

Generally, once the lid 216 is aligned with carrier 208, by way of positioning the alignment protrusion(s) 255 within the alignment receptacle(s) 218, site pockets 261 and lid pedestals 264 may become aligned with the associated IC chip 202. For example, the center of site pocket $261_1$ and the center of lid pedestal $264_1$ may be coincident with the y-axis center of chip $202_1$, the center of site pocket $261_2$ and the center of lid pedestal $264_2$ may be coincident with the y-axis center of chip $202_2$, the center of site pocket $261_3$ and the center of lid pedestal $264_3$ may be coincident with the y-axis center of chip $202_3$, and the center of site pocket $261_4$ and the center of lid pedestal $264_4$ may be coincident with the y-axis center of chip $202_4$.

In some embodiments the upper surface 253 of carrier 208 may be coplanar with surface 253 of carrier deck 250.

A compressive force may be generated between the fixture cover 280 and the carrier deck 250 such that a respective lid pedestal 264 is loaded toward a respective IC chip 202 and such that an integral lid foot 260 is loaded toward the carrier 208. Fixture cover 280 may be loaded toward deck 250 by inserting the fasteners 700 within clearances 619 of lid 280 and engaging the fasteners 700 with associated fastener receptacles 257 of deck 250. When multiple fasteners 700 are utilized, the multiple fasteners 700 may be engaged with associated fastener receptacles 257 simultaneously to maintain or promote movement of fixture cover 280 toward deck 250 in only the y-axis direction. Movement of the fixture cover 280 toward deck 250 engages lid pedestals 620 with the top surface of lid 216 generally above the associated lid pedestal 264. The spring 630 may provide a predetermined constant force from lid pedestals 620 with the top surface of lid 216 generally above the associated lid pedestal 264 in the y-axis direction.

While the package 224 is under compression, thermal interface material 212 between respective lid pedestals 264 and respective IC chips 202 and seal band material 220 between the integral foot 260 and the carrier 208 may be cured. The compressive load between Fixture cover 280 and carrier deck along with the curing of seal band material 220 may generally flatten the convex carrier 208 of FIG. 4B such that the upper surface and lower surface of carrier 208 become flat (i.e. parallel with the xz plane). Subsequently, the multi IC chip carrier package 224 may be removed from Fixture cover 280 and carrier deck 250.

Figure 10:
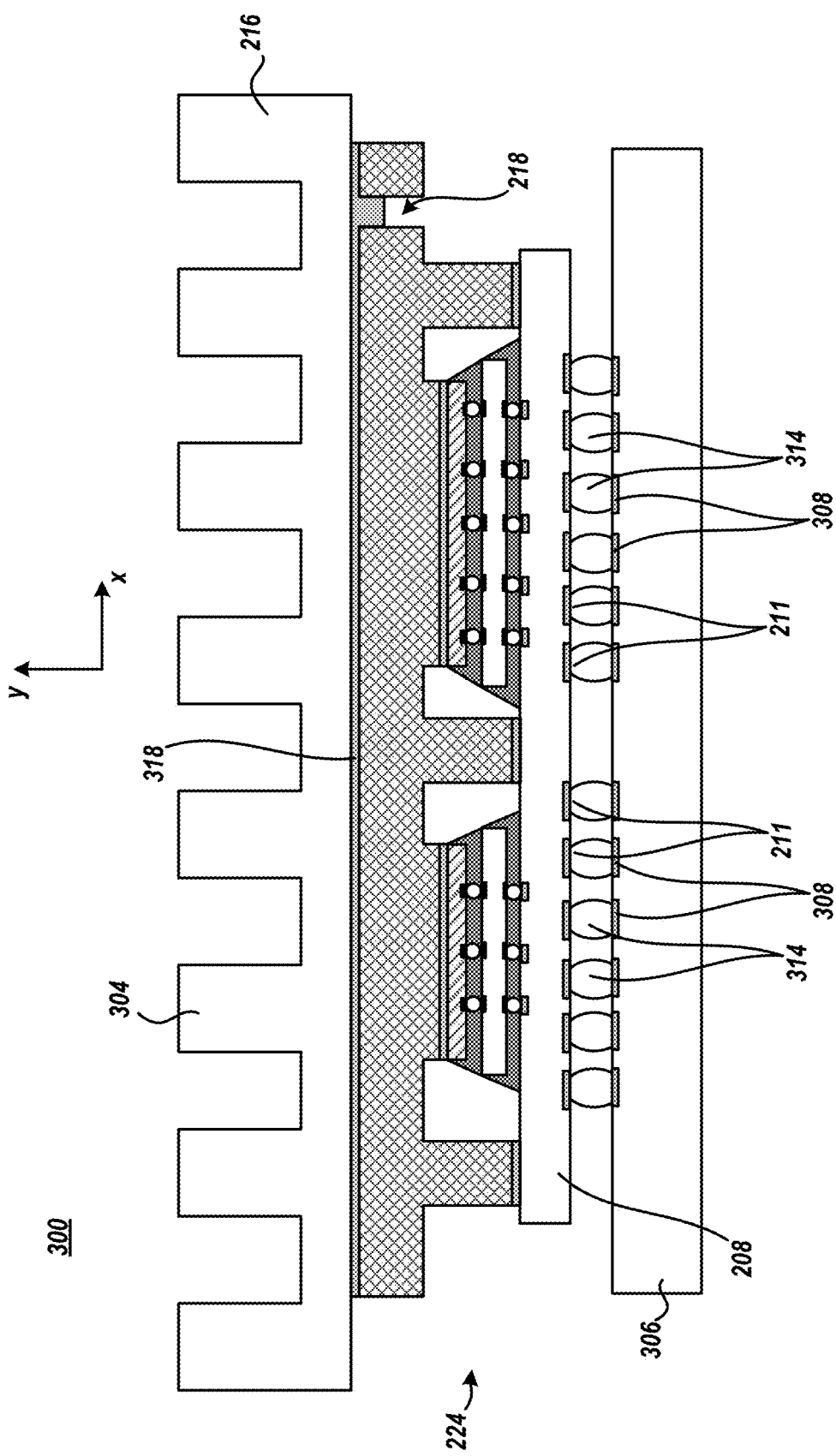
FIG. 10 depicts a cross-section view of a multi IC chip carrier package at a particular fabrication stage, according to one or more embodiments of the present invention.

FIG. 10 depicts a cross-section view of multi IC chip carrier package 224 at a particular fabrication stage, according to one or more embodiments of the present invention. At the present fabrication stage a heat sink 304 may be attached to the top surface of lid 216 with thermal interface material 318 and the carrier 208 may be electrically connected to an electronic system 300 motherboard 306.

Electronic system 300 includes multiple IC chip carrier package 224 and motherboard 306. Electronic system 300 may be for example a computer, server, mobile device, tablet, kiosk, or the like. Generally, during operation of electronic system 300, heat is removed from the IC chips 202. In this situation, lid 216 is both a cover and a conduit for heat transfer.

Package 224 may be electrically connected to a motherboard 306 via interconnects 314. Motherboard 306 may be the main printed circuit board of electronic system 300 and includes electronic components, such as a graphics processing unit, memory, and the like, and provides connectors for other peripherals. An interconnect 314 electrically connect a contact 211 upon or within the lower surface of carrier 208 to a contact 308 upon or within the upper surface of motherboard 306. Interconnects 314 may be a wire bond, solder bond, stud, conductive ball, conductive button, and the like. Interconnects 314 may be larger and thus more robust than interconnects 222. When package 224 is seated upon motherboard 306 a reflow process may be performed to join interconnects 314 to electrical contacts 211 of carrier 208 and contacts 308 of motherboard 306. Alternately, a mechanical pressurized interconnect via an intervening socket may be utilized.

To assist in the removal of heat from IC chips 202, a heatsink 304 may be thermally joined to package 224 via thermal interface material 318. Heatsink 304 cools IC chips 202 by dissipating heat. Heat sink 304 may be a passive heat exchanger and may dissipate heat into the surrounding air or may be part of an active heat exchanging system and may dissipate heat into a cooled fluid. As such, during operation of electronic system 300, heat transfer exists from each IC chip 202 through thermal interface materials 212, to lid 216, and to heat sink 304 through thermal interface material 318. In some embodiments, the interface material 318 may be located within one or more alignment receptacles 218.

Figure 11:
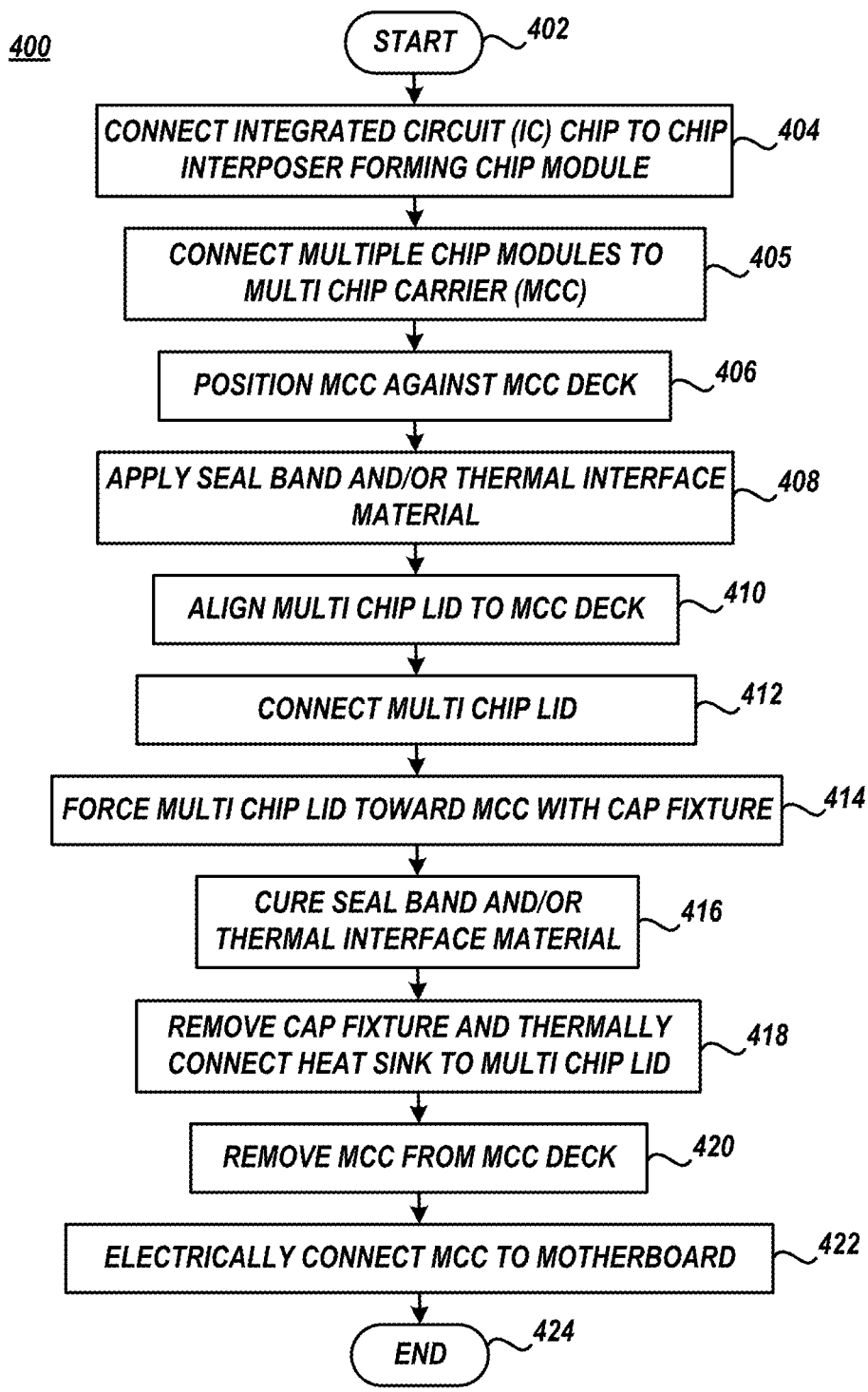
FIG. 11 depicts a method of fabricating a multi IC chip carrier package, according to one or more embodiments of the present invention.

FIG. 11 depicts a method 400 of fabricating multi IC chip carrier package 224, according to one or more embodiments of the present invention. The order of the blocks was chosen for illustration purposes only and description of the such blocks may be performed out of order relative to that order illustrated, when appropriate.

Method 400 begins at block 402 and continues with forming or connecting an interposer 205 upon or to IC chip 202 forming a IC chip and interposer package 401 which may also be referred to as a chip module (block 404). For example, a matrix of interconnects 222 electrically connect a respective matrix of contacts 309 of the IC chip 202 with a respective matrix of contacts 409 upon or within the upper surface of interposer 205. In some embodiments, underfill 411 may be formed at least between the underside of each IC chip 202 and the upper surface of interposer 205 surrounding interconnects 222.

Method 400 may continue with connecting multiple chip modules to the multichip carrier (block 405). For example, a matrix of interconnects 222 electrically connect a respective matrix of contacts 509 of the interposer 205 with a respective matrix of contacts 209 upon or within the upper surface of carrier 208. In some embodiments, underfill 511 may be formed at least between the underside of each interposer 205 and the upper surface of carrier 208 surrounding interconnects 222. In some embodiments, at the present method 400 stage, the shape of carrier 208 may be convex.

Method 400 may continue positioning the carrier 208 against the carrier deck 250 (block 406). For example, the carrier 208 is positioned within the carrier deck 250 such that movement of carrier 208 becomes fixed relative to the carrier deck 250. In some embodiments, carrier 208 is positioned with a recess 252 of carrier deck 250.

Method 400 may continue with applying seal band 220 upon the carrier 208 around the circumference of each site 203 and/or the circumference of each chip 202 and/or applying seal band 220 upon surface 262 of lid 216 (block 408). In some embodiments, thermal interface material 212 is applied to the upper surface of each IC chip 202 and/or applied to surface 266 of each pedestal 264 of lid 216.

Method 400 may continue with aligning lid 216 with deck 250 (block 410). The lid 216 may be positioned relative to carrier 208 by positioning one or more respective alignment protrusions 255 of the carrier deck 250 within a respective one or more alignment receptacles 218 of lid 216. Generally, once the lid 216 is aligned with deck 250, by way of positioning the alignment protrusion(s) 255 within the alignment receptacle(s) 218, site pockets 261 and lid pedestals 264 may become aligned with the associated IC chip 202. For example, the center of site pocket $261_1$ and the center of lid pedestal $264_1$ may be coincident with the y-axis center of chip $202_1$, the center of site pocket $261_2$ and the center of lid pedestal $264_2$ may be coincident with the y-axis center of chip $202_2$, the center of site pocket $261_3$ and the center of lid pedestal $264_3$ may be coincident with the y-axis center of chip $202_3$, and the center of site pocket $261_4$ and the center of lid pedestal $264_4$ may be coincident with the y-axis center of chip $202_4$.

Method 400 may continue with connecting the lid 216 to the carrier 208 by way of seal band 220 and/or connecting the lid 216 to each IC chip 202 by way of thermal interface material 212 (block 412). For example, lid 216 is moved downward in the y-axis direction toward the carrier 208 and IC chips 202 whilst the alignment protrusion(s) 255 engage within the alignment receptacle(s) 218 until the lid 216 contacts carrier 208 (e.g., via seal band 220, or the like) and/or contacts each IC chip 202 (e.g., via thermal interface materials 220, or the like).

Method 400 may continue with the fixture cover 280 contacting the upper surface of lid 216 and forcing the lid 216 toward the carrier 208 (block 414). For example, the fixture cover 280 moves toward deck 250 and the cover pedestals 620 exert a force against the lid 216 above the lid pedestals 216 toward the carrier deck thereby compressing lid 216 into carrier 208 and into IC chips 202. Such compressive force may flatten the generally convex carrier 208 such that the upper surface of carrier 208 is parallel with the x-axis. This compressive force may provide or generally result in a minimum thermal interface material 212 thickness to promote an increased amount of heat transfer from each chip 202 into lid 216.

Method 400 may continue with curing the seal band material 220 and/or curing the thermal interface material 212 (block 416). For example, the package 224 under compression, may be heated so as to toughen or harden the polymer material by cross-linking of polymer chains of the material of the seal band material 220 and/or the thermal interface material 212. When cooled, the cured seal band connection between the lid 216 and the carrier 208 may maintain the flattened carrier 208 to be parallel with the x-axis.

Method 400 may continue with removing or otherwise disconnecting the fixture cover 280 from the lid 216 so as to expose the upper surface of lid 216 and subsequently connecting a heat sink 304 to the upper surface of lid 216 (block 418). For example, fixture cover 280 is removed and thermal interface material 318 may be applied to the upper surface of lid 216 and/or to the bottom surface of heatsink 304. The heatsink 304 may be joined to the lid 216. In some embodiments, the package 224 may be again heated to cure the thermal interface material 318.

Method 400 may continue with removing the carrier 208 from the carrier deck 250 (block 420). For example, the carrier 208 may be removed from recess 252 of carrier deck 250. Method 400 may continue with connecting the carrier 208 to motherboard 306 (block 422). Carrier 208 may be electrically connected to a motherboard 306 via interconnects 314. For example, a matrix of interconnects 314 connect a matrix of contacts 211 upon or within the lower side of carrier 208 to a matrix of contacts 308 upon or within the upper surface of motherboard 306. Method 400 may end at block 424.

For clarity, the perimeter or circumferential shapes of each associate site 203, IC chip 202, interposer 205, lid pedestal 264, and/or spring pedestals 620 may be generally similar (i.e. the same plus or minus an appropriate manufacturing tolerance(s)) and concentric about the same center axis.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the order of the fabrication stages listed in depicted blocks may occur out of turn relative to the order indicated in the Figures, may be repeated, and/or may be omitted partially or entirely. The terminology used herein was chosen to best explain the principles of the embodiment, the practical application or technical improvement over technologies found in the marketplace, or to enable others of ordinary skill in the art to understand the embodiments disclosed herein.

References herein to terms such as "vertical", "horizontal", and the like, are made by way of example, and not by way of limitation, to establish a frame of reference. The term "horizontal" as used herein is defined as a plane parallel to the conventional plane or upper surface of the carrier 208, regardless of the actual spatial orientation of the carrier 208. The term "vertical" refers to a direction perpendicular to the horizontal, as just defined. Terms, such as "on", "above", "below", "side" (as in "sidewall"), "higher", "lower", "over", "top", "under", "beneath", and the like, are defined with respect to the horizontal plane. It is understood that various other frames of reference may be employed for describing the present invention without departing from the spirit and scope of the present invention.

What is claimed is:

1. An electronic device fabrication method comprising:
positioning a multiple IC chip carrier against a carrier deck that comprises a plurality of alignment protrusions;
aligning a lid, comprising a plurality of alignment receptacles, with the multiple IC chip carrier by receiving the plurality of alignment protrusions within the plurality of alignment receptacles;
connecting the lid to the multiple IC chip carrier and connecting the lid to each IC chip of the multiple IC chip carrier; and
removing the multiple IC chip carrier from the carrier deck.

2. The method of claim 1, further comprising:
applying a seal band material upon the multiple IC chip carrier around a circumference of each IC chip site.

3. The method of claim 1, further comprising:
applying a seal band material upon an underside surface of an integral lid foot of the lid.

4. The method of claim 1, further comprising:
applying a thermal interface material upon an upper surface of each IC chip of the multiple IC chip carrier.

5. The method of claim 1, further comprising:
applying a thermal interface material upon an underside surface of each pedestal of the lid.

6. The method of claim 1, further comprising:
curing a seal band that exists between the lid and the multiple IC chip carrier; and
curing thermal interface material that exists between the lid and each IC chip of the multiple IC chip carrier.

7. The method of claim 6, further comprising:
compressing the lid against the multiple IC chip carrier by applying a force from a fixture cover against the lid towards the carrier deck; and
removing the fixture cover from the lid, subsequent to curing the seal band and subsequent to curing the thermal interface material.

8. The method of claim 7, wherein compressing the lid against the multiple IC chip carrier flattens the multiple IC chip carrier.

9. The method of claim 1, further comprising:
connecting a heatsink to the lid upper surface.

10. The method of claim 1, further comprising:
connecting the multiple IC chip carrier bottom surface to a motherboard.

11. A multiple integrated circuit (IC) chip carrier package fabrication system comprising:
a carrier deck comprising a carrier recess and a plurality of alignment protrusions;
a multiple IC chip carrier comprising multiple IC chips, the multiple IC chip carrier positioned within the carrier recess; and
a lid comprising multiple IC chip pockets that each have a IC chip pedestal, an underside integral lid foot, and a lid brim that includes a plurality of alignment receptacles, wherein the plurality of alignment protrusions are positioned within the plurality of alignment receptacles and wherein the underside integral lid foot is connected to the multiple IC chip carrier and wherein each of the IC chip pedestals is connected to an IC chip of the multiple IC chip carrier.

12. The system of claim 11, further comprising:
a fixture cover connected to the lid upper surface and moveable towards the carrier deck to compress the lid against the multiple IC chip carrier and to compress the lid against the multiple IC chips.

13. The system of claim 11, a seal band material between the multiple IC chip carrier and the underside integral lid foot.

14. The system of claim 11, further comprising:
thermal interface material between each IC chip and each IC chip pedestal.

15. The system of claim 11, wherein an upper surface of each alignment protrusion is between an underside surface of the lid brim and the lid upper surface.

16. The system of claim 11, wherein when the plurality of alignment protrusions are positioned within the plurality of alignment receptacles, a vertical center axis of each IC chip is coincident with a center of an associated IC chip pedestal.

17. The system of claim 11, wherein one or more of the multiple IC chips is connected to the multiple IC chip carrier in a landscape orientation and wherein one or more of the multiple IC chips is connected to the multiple IC chip carrier in a portrait orientation.

18. A multiple IC chip carrier package fabrication method comprising:
positioning a multiple IC chip carrier against a carrier deck that comprises a plurality of alignment protrusions;
aligning a lid, comprising a plurality of alignment receptacles, with the multiple IC chip carrier by receiving the plurality of alignment protrusions within the plurality of alignment receptacles;
connecting the lid to the multiple IC chip carrier and connecting the lid to each IC chip of the multiple IC chip carrier; and
removing the multiple IC chip carrier from the carrier deck.

19. The method of claim 18, further comprising:
compressing the multiple IC chip carrier and the lid by applying a compressive force between the carrier deck and a fixture cover that is connected to the lid upper surface; and
removing the fixture cover from the lid upper surface.

20. The method of claim 19, wherein compressing the multiple IC chip carrier and the lid flattens the multiple IC chip carrier.

* * * * *